(12) United States Patent
Suzuya

(10) Patent No.: US 6,666,380 B1
(45) Date of Patent: Dec. 23, 2003

(54) NON-CONTACT IC CARD AND IC CARD COMMUNICATION SYSTEM

(75) Inventor: Nobuhito Suzuya, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 134 days.

(21) Appl. No.: 09/661,918

(22) Filed: Sep. 14, 2000

(30) Foreign Application Priority Data

Sep. 16, 1999 (JP) .......................................... 11-262151

(51) Int. Cl.⁷ .............................................. G06K 19/06
(52) U.S. Cl. ........................ 235/492; 235/380; 235/487
(58) Field of Search ................................ 235/380, 487, 235/488, 492; 343/741, 742, 866, 867, 895

(56) References Cited

U.S. PATENT DOCUMENTS

| | | | |
|---|---|---|---|
| 5,774,339 A | * 6/1998 | Ohbuchi et al. | 361/737 |
| 5,852,289 A | * 12/1998 | Masahiko | 235/380 |
| 5,880,934 A | * 3/1999 | Haghiri-Tehrani | 235/492 |
| 5,999,409 A | * 12/1999 | Ando et al. | 361/737 |
| 6,073,856 A | * 6/2000 | Takahashi | 235/492 |
| 6,089,461 A | * 7/2000 | Murohara | 235/380 |
| 6,478,228 B1 | * 11/2002 | Ikefuji et al. | 235/492 |

FOREIGN PATENT DOCUMENTS

| | | |
|---|---|---|
| JP | 7-57067 | 3/1995 |
| JP | 2000-90226 | 3/2000 |
| JP | 2000-99673 | 4/2000 |

OTHER PUBLICATIONS

Ikuo Yoshida, et al., "Bare–Chip Technology Using Anisotropic Conductive Films," Journal of Circuit Mounting Society, vol. 12, No. 7, (1997), pp. 473–476, Month missing.

* cited by examiner

Primary Examiner—Michael G. Lee
Assistant Examiner—Ahshik Kim
(74) Attorney, Agent, or Firm—Finnegan, Henderson, Farabow, Garrett & Dunner, L.L.P.

(57) ABSTRACT

A non-contact IC card comprises: a substantially rectangular insulating substrate; a semiconductor chip mounted on a first face of the insulating substrate; and an antenna coil for transmitting information and for enhancing the mechanical strength of the insulating substrate, the antenna coil being arranged on the first face of the insulating substrate along the outer periphery of the first face, and the antenna coil having first and second connecting terminals which are connected to the semiconductor chip. Thus, it is possible to provide a non-contact IC card capable of enhancing the connection reliability of an IC chip mounting portion, maintaining communication characteristics, and maintaining a high mechanical strength.

14 Claims, 6 Drawing Sheets

NON-CONTACT IC CARD AND IC CARD COMMUNICATION SYSTEM

BACKGROUND OF THE INVENTION

1. Field of the Invention

The present invention relates generally to a non-contact IC card wherein a semiconductor memory device is used as an IC chip. More specifically, the invention relates to the structure of an antenna coil which is formed in a non-contact IC card. The present invention is used for, e.g., a credit card or a commodity tag.

2. Related Background Art

FIG. 9 is a plan view of a conventional non-contact IC card, and FIG. 10 is a sectional view of the non-contact IC card taken along line A–A' of FIG. 9. A quadrangular insulating substrate 1 to be an IC card substrate is made of a synthetic resin, such as a polyimide resin or an epoxy resin. The shape of the insulating substrate 1 is like a card about 5.5 by about 8.5 millimeters. An elliptical antenna coil 2 of copper or aluminum is bonded to the central portion of the major surface of the insulating substrate 1 by means of an adhesive 6. An IC chip 4 is formed at a suitable position outside of the antenna coil 2. The IC chip 4 is arranged above IC chip connecting terminals 8 and 8', which are formed on one end and the other end of the antenna coil 2, to be connected to the insulating substrate 1 by means of an adhesive 5, such as a non conductive paste (NCP) or an anisotropic conductive adhesive. As shown in this figure, a bump 9 and the IC chip connecting terminals 8 and 8', which are arranged between the IC chip 4 and the insulating substrate 1, are surrounded by the anisotropic conductive adhesive 5. The IC chip 4 is formed with the bump 9 on a connecting electrode (not shown), such as an aluminum pad. The bump 9 is bonded to the IC chip connecting terminals 8 and 8'.

Since the IC chip connecting terminals 8 and 8' formed on both ends of the antenna coil 2 are close to each other to be connected to the IC chip 4, one end of the antenna coil 2 and a coil conductor close thereto must be beyond the same conductor to be close to the other end. Therefore, in order to prevent contact with each other, the antenna coil 2 is connected to a reverse conductor 7. The reverse conductor 7 electrically connects they one end of the antenna coil 2 and the coil conductor, which is close thereto, with the coil conductor of other portions by a connecting wiring which is embedded in two through holes (not shown) formed in the insulating substrate 1.

At present, in a non-contact card for use in a telephone card or a commutation ticket, a conductor serving as an antenna coil is formed on the major surface thereof. This conductor has uniform thickness at any positions on the insulating substrate which is an IC card substrate. Since the conductor is formed by etching a metal foil, such as a copper foil, sputtering or applying a conductive paste, any portions are usually uniformly formed. In a non-contact IC card wherein information is transmitted in a non-contact form, one of means for extending the communication range from a reader/writer is to reduce the electrical resistance of the antenna coil. Since the electrical resistance of the conductor is inversely in proportion to the sectional area thereof, the antenna coil portion of the non-contact IC card must be particularly wide and thick.

On the other hand, in a technique for mounting a semiconductor device using an anisotropic conductive adhesive or the like, it has been reported that the reliability of the connecting portion is enhanced as the distance between a semiconductor device (IC) and a substrate, on which the semiconductor device is mounted, is decreased (see Journal Of Circuit Mounting Society Vol.12, No.7 (1997), P.473, "Pair Chip Mounting By Anisotropic Conductive Adhesive Film"). It was revealed from this report that a flip chip mounting structure using an Au wire bump and an anisotropic conductive adhesive film can sufficiently temperature cycle resistance by controlling the height of connection. Furthermore, it was confirmed that the even in reliability test in HiPM, even after 500 cycles of tests, the connection is held, so that there is no problem in quality.

In order to decrease the distance between the substrate and the semiconductor device, it is considered that the height of the Au bump previously formed on the semiconductor element (IC chip) is decreased. However, if the conductor is made of a soft material, such as Al foil or Ag paste, the bump is embedded into the conductor, so that the distance between the substrate and the IC chip can not be controlled by using the Au bump. For that reason, it is required to control the distance between the substrate and the IC chip by decreasing the conductor thickness. In view of the foregoing, with respect to the conductor thickness of the non-contact IC card, there is a problem in that it is required to thicken the antenna coil to decrease the electrical resistance in order to maintain communication characteristics although it is desired that the thickness of the connecting terminal of the IC chip is decreased in order to improve the mounting reliability.

In addition, the non-contact IC card is particularly used for an IC telephone card or the like. In such a use, the non-contact IC card must have, e.g., a structure which withstands mechanical strength while maintaining the elasticity of the card so as not to be broken when the card is put in a trouser pocket to be under the hip. However, in general, it is very difficult for such a card to maintain a high mechanical strength.

SUMMARY OF THE INVENTION

It is therefore an object of the present invention to eliminate the aforementioned problems and to provide a non-contact IC card capable of enhancing the connection reliability of an IC chip mounting portion, maintaining communication characteristics, and maintaining a high mechanical strength, and a communication system using the same.

In order to accomplish the aforementioned and other objects, according to one aspect of the present invention, a non-contact IC card comprises: a substantially rectangular insulating substrate; a semiconductor chip mounted on a first face of the insulating substrate; and an antenna coil for transmitting information and for enhancing the mechanical strength of the insulating substrate, the antenna coil being arranged on the first face of the insulating substrate along the outer periphery of the first face, and the antenna coil having first and second connecting terminals which are connected to the semiconductor chip.

According to another aspect of the present invention, an IC card communication system comprises a non-contact IC card and a reader/writer, the non-contact IC card comprising: a substantially rectangular insulating substrate; a semiconductor chip mounted on a first face of the insulating substrate; and an antenna coil for transmitting information and for enhancing the mechanical strength of the insulating substrate, the antenna coil being arranged on the first face of the insulating substrate along the outer periphery of the first face, and the antenna coil having first and second connecting terminals which are connected to the semiconductor chip, and the non-contact IC card transmitting signals from and to the reader/writer via the antenna coil by the electromagnetic induction.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

First, referring to FIGS. 1, 2, 7 and 8, the first preferred embodiment of the present invention will be described.

Figure 1A:
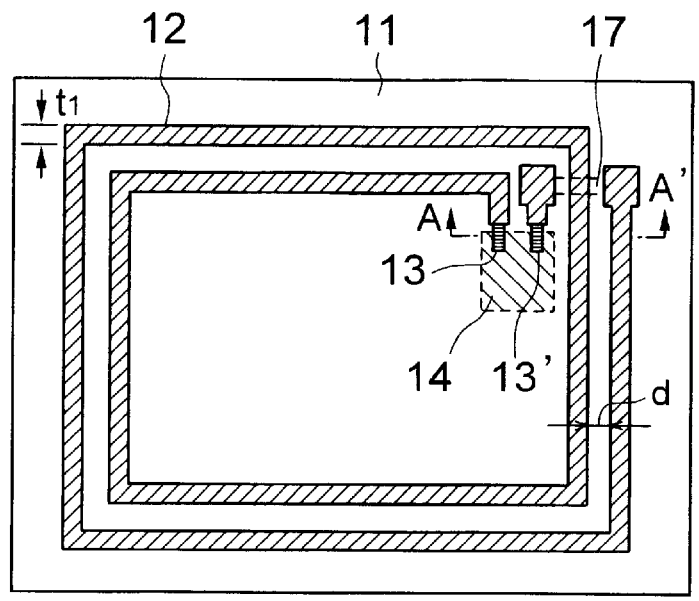
FIGS. 1(a) and 1(b) are plan and bottom views of the first preferred embodiment of a non-contact IC card according to the present invention.
Figure 1B:
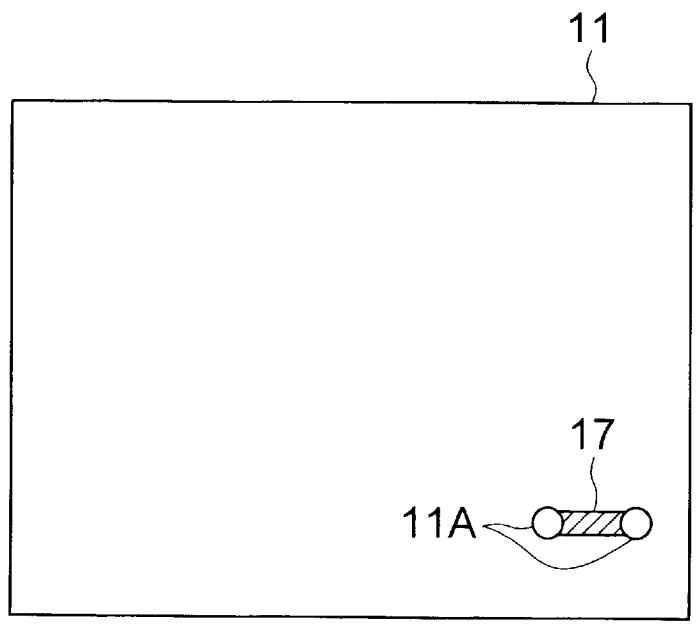
Figure 2:
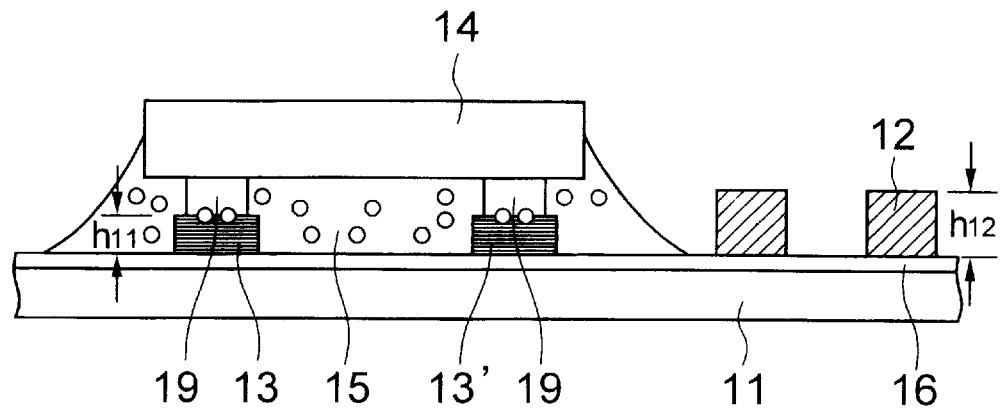
FIG. 2 is a sectional view of an IC chip mounting portion of the first preferred embodiment of a non-contact IC card according to the present invention.
Figure 7:
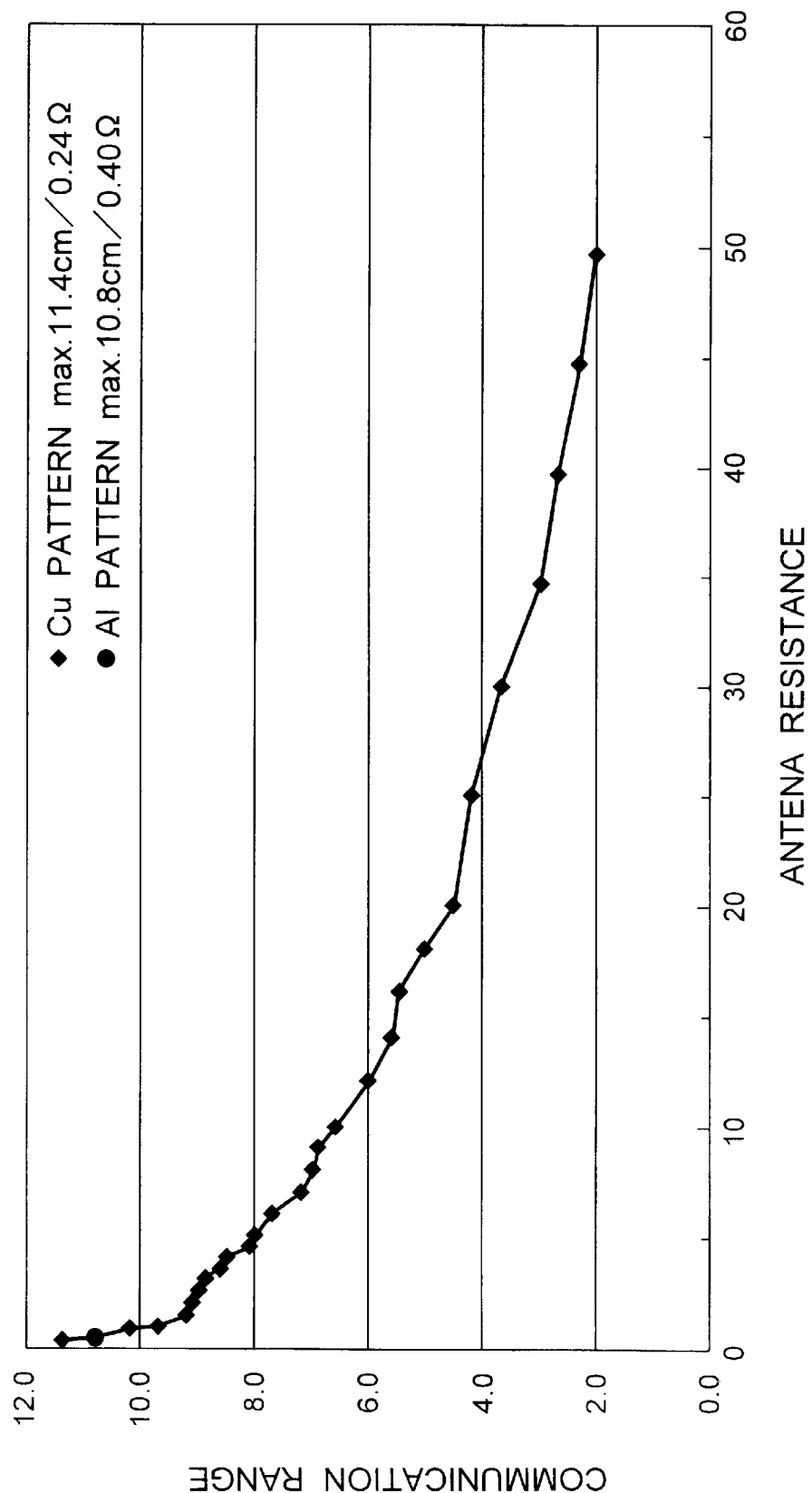
FIG. 7 is a graph showing the dependence of the distance between a reader/writer and a non-contact IC card on an antenna resistance.
Figure 8:
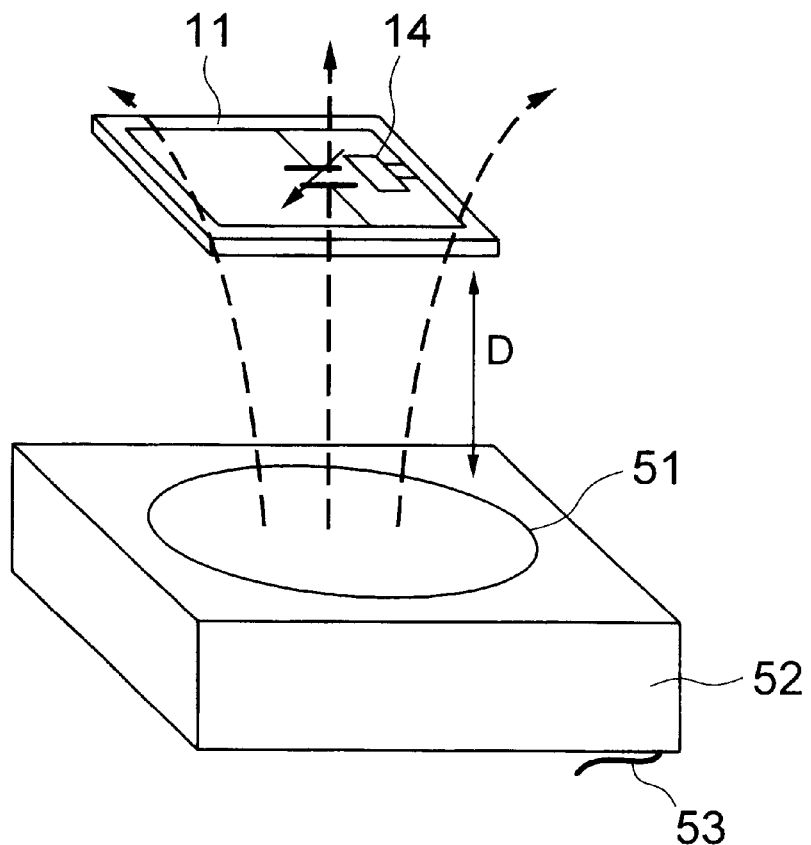
FIG. 8 is a schematic perspective view of an IC card communication system.
Figure 9:
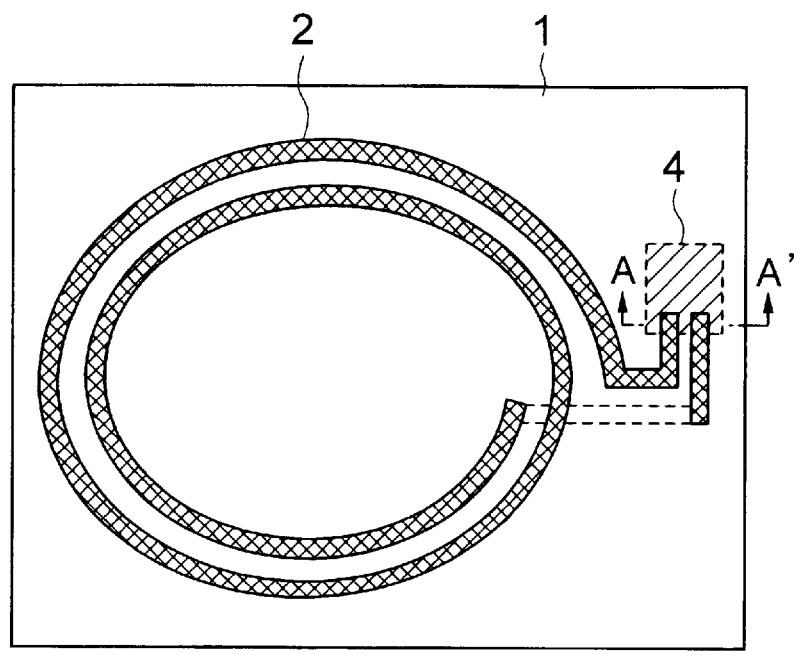
FIG. 9 is a plan view of a conventional non-contact IC card.
Figure 10:
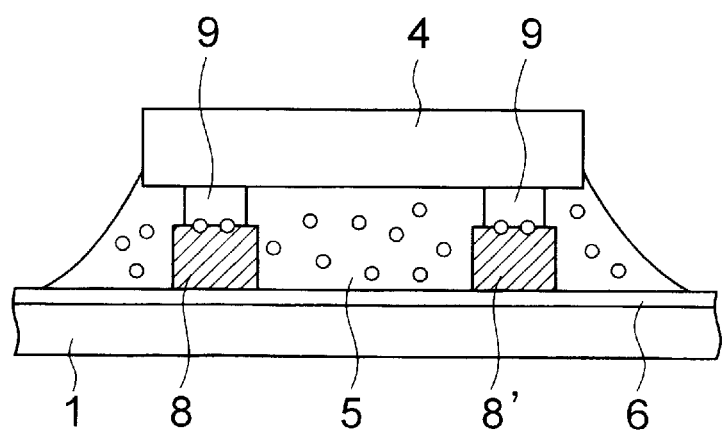
FIG. 10 is a sectional view of an IC chip connecting portion of a conventional non-contact IC card.

FIG. 1 is a plan view of a non-contact IC card according to the present invention, and FIG. 2 is a sectional view of an 20 IC chip mounting portion of a non-contact IC card according to the present invention (a sectional view taken along line A–A' of FIG. 1). FIG. 7 is a characteristic diagram showing the relationship between the antenna resistance of an antenna coil of FIG. 1 and a communication distance, and FIG. 8 is a schematic perspective view of an IC card communication system. The non-contact IC card comprises: an insulating substrate 11 of an insulating material, such as an epoxy resin or a polyimide resin; an antenna coil 12 of a conductor, such as aluminum or copper; IC chip connecting terminals 13 and 13' which constitute a part of the antenna coil 12 and which are electrically connected to an IC chip 14 by means of an adhesive 15, such as an anisotropic conductive adhesive or an NCP; the IC chip 14; and an adhesive 16 for sticking the antenna coil 12 on the insulating substrate 11. The IC card has a short side length of 54 mm, a long side length of 85.6 mm and a thickness of 0.76 mm. The antenna coil 12 of copper or aluminum (Al) is bonded to the major surface of the insulating substrate 11 by means of the adhesive 16. The IC chip 14 is formed inside of the antenna coil 14 at a suitable position.

The IC chip 14 is arranged above the IC chip connecting terminals 13 and 13', which are formed on one end and the other end of the antenna coil 12, to be connected to the insulating substrate 11 by means of the adhesive 15, such as an NCP. As shown in the figure, a bump 19 and the IC chip connecting terminals 13 and 13', which are arranged between the IC chip 14 and the insulating substrate 11, are surrounded by the adhesive 15, such as an anisotropic conductive adhesive or an NCP. The IC chip 14 is formed with the bump 19 on a connecting electrode (not shown), such as an aluminum pad. This bump 19 is bonded to the IC chip connecting terminals 13 and 13'. Since the IC chip connecting terminals 13 and 13' formed on both ends of the antenna coil 12 are close to each other to be connected to the IC chip 14, one end of the antenna coil 12 and a coil conductor close thereto must be beyond the same conductor to be close to the other end. Therefore, in order to prevent contact with each other, the antenna coil 12 is connected to a reverse conductor 17. The reverse conductor 17 electrically connects the one end of the antenna coil 12 and the coil conductor, which is close thereto, with the coil conductor of other portions by a connecting wiring which is embedded in two through holes 11A formed in the insulating substrate 11. The coil conductor of the antenna portion has a thickness of 30 $\mu$m and a width of 1.75 mm. The distance between the conductors of the antenna portion is 1.75 mm, and the distance (d) between the outer periphery of the coil portion and the side of the insulating substrate is 2.45 mm. The wiring pitch of the conductor is 3.25 mm. Furthermore, in this preferred embodiment, the wiring pitch is suitably in the range of from 2.45 mm to 3.25 mm. In addition, if the thickness of the Al conductor is 30 $\mu$m or more, irregularities remain on a post-card laminated on the surface of the IC card, so that this is not preferred.

In the non-contact IC card for use in a telephone card or a commutation ticket, a conductor serving as an antenna coil is formed on the major surface thereof. This conductor has uniform thickness at any positions on the insulating substrate which is an IC card substrate. Since the conductor is formed by etching a metal foil, such as a copper foil, sputtering or applying a conductive paste, any portions are usually uniformly formed. Therefore, in this preferred embodiment, the IC chip connecting terminal portion is suitably thinned by etching, or the formation of the antenna coil is suitably divided into the formation of the antenna portion and the formation of the IC chip connecting terminal portion.

In a non-contact IC card wherein information is transmitted in a non-contact form, one of means for extending the communication range from a reader/writer is to reduce the electrical resistance of the antenna coil. Since the electrical resistance of the conductor is inversely in proportion to the sectional area thereof, the antenna coil portion of the non-contact IC card must be particularly wide and thick. On the other hand, in a technique for mounting a semiconductor device using an adhesive, such as an anisotropic conductive adhesive or an NCP, it is clear as described above that the reliability of the connecting portion is enhanced as the distance between a semiconductor device and a substrate, on which the semiconductor device is mounted, is decreased.

In this preferred embodiment, the portions of the IC chip connecting terminals 13 and 13', which are arranged below the IC chip 14, of the conductor forming the antenna coil 12 are thinner than other portions. If the IC chip connecting terminal portion is thus thinned, it is possible to reduce the decrease of the reliability of the IC chip connecting portion due to the repetition of thermal expansion and thermal contraction of the adhesive 15, such as an anisotropic conductive adhesive or an NCP, which occur in longitudinal directions in FIG. 2. Simultaneously, if the antenna portion is thickened, it is possible to reduce the electrical resistance of the antenna coil 12. If the conductor thickness of the antenna portion is set to be a suitable value, it is possible to improve the mounting reliability of the IC chip connecting portion while it is possible to extend the communication range of the non-contact IC card.

The conductor forming the antenna coil is made of copper (Cu), aluminum (Al), silver (Ag) paste or the like. The communication characteristics of the non-contact IC card depend on inductance of the coil, the number of turns, the wiring pitch of the coil, the condenser capacity, the resistance and so forth. If elements other than the electrical resistance of the antenna portion are optimized and if the material of the conductor is Al, the electrical resistance of the antenna portion is about 0.4 Ω on condition that the conductor thickness (h12 in FIG. 2) of the antenna coil is 30 µm and the conductor width (t1 in FIG. 1) thereof is 1.5 mm. When the thickness (h12) of the antenna portion is 60 µm, the electrical resistance of the antenna coil portion is 0.2 Ω. The conductor thickness (h11 in FIG. 1) of the IC chip connecting terminals 13 and 13' is optimally in the range of from 15 to 20 µm since the lower limit of the height of the Au bump is about 15 µm.

In addition, the antenna coil 12 is formed along each side of the insulating substrate 11, and the antenna coil 12 is spaced from each side edge by a distance (d in FIG. 1) of 3 mm or less so as to be substantially coincident with each side edge. Because the rigidity of the IC card is weakened if the antenna coil 12 is spaced from the side edge by a distance of more than 3 mm.

Referring to FIGS. 7 and 8, an IC card communication system will be described below.

As shown in FIG. 8, this communication system is characterized in that a non-contact IC card transmits signals from and to a reader/writer via an antenna coil by the electromagnetic induction. If an alternating voltage is generated in the antenna coil 51 of the reader/writer 52 and if an IC card using an insulating substrate 11 as a card approaches the reader/writer at a predetermined distance (D), an electromotive force is generated in the antenna coil of the IC card by the variation in magnetic field (the alternating voltage is converted into a digital signal of a constant voltage by means of a converting circuit provided in the IC chip 14). A reference numeral 53 shows a power supply of reader/writer 52.

Such a non-contact IC card can be used as a telephone card, which is conventionally a magnetic card, to prevent data from being altered, or as a commutation ticket so as to allow the user to pass through a ticket gate while the commutation ticket is put in a commutation ticket case, so that the non-contact IC card is easier to handle.

FIG. 7 is a characteristic diagram showing the dependence of the distance (D) between the reader/writer and the non-contact IC card, on the antenna resistance. A variable resister was mounted on a copper antenna having a low antenna resistance, and the communication range was measured when the antenna resistance was high. As the antenna resistance increases, the communication range (D) decreases, so that the antenna resistance is greatly influenced by the communication range.

Figure 3:
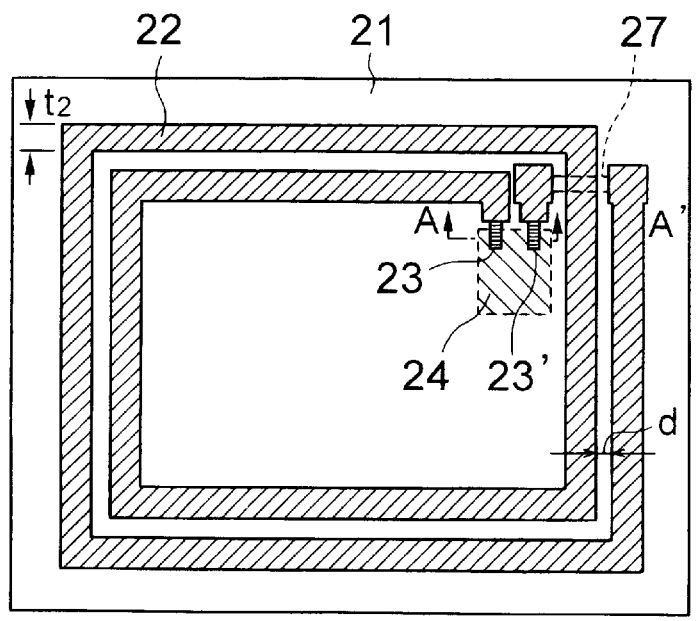
FIG. 3 is a plan view of the second preferred embodiment of a non-contact IC card according to the present invention.
Figure 4:
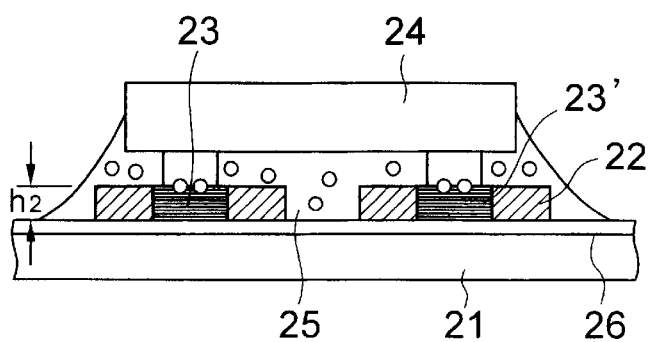
FIG. 4 is a sectional view of an IC chip mounting portion of the second preferred embodiment of a non-contact IC card according to the present invention.

Referring to FIGS. 3 and 4, the second preferred embodiment of the present invention will be described below.

FIG. 3 is a plan view of a non-contact IC card according to the present invention, and FIG. 4 is a sectional view of an IC chip mounting portion of a non-contact IC card according to the present invention (a sectional view taken along line A–A' of FIG. 3). The non-contact IC card comprises: an insulating substrate 21 of an insulating material, such as an epoxy resin or a polyimide resin; an antenna coil 22 of a conductor, such as aluminum or copper; IC chip connecting terminals 23 and 23' which constitute a part of the antenna coil 22 and which are electrically connected to an IC chip 24 by means of an adhesive 25, such as an anisotropic conductive adhesive or an NCP; the IC chip 24; and an adhesive 26 for sticking the antenna coil 22 on the insulating substrate 21. The IC card has a short side length of 54 mm, a long side length of 85.6 mm and a thickness of 0.76 mm. Since the IC chip connecting terminals 23 and 23' formed on both ends of the antenna coil 22 are close to each other to be connected to the IC chip 24, one end of the antenna coil 22 and a coil conductor close thereto must be beyond the same conductor to be close to the other end. Therefore, in order to prevent contact with each other, the antenna coil 22 is connected to a reverse conductor 27. The reverse conductor 27 electrically connects the one end of the antenna coil 22 and the coil conductor, which is close thereto, with the coil conductor of other portions by a connecting wiring which is embedded in two through holes formed in the insulating substrate 21.

In this preferred embodiment, the antenna coil is thicker than that in the first preferred embodiment, and the thickness of the IC chip connecting terminal of the conductor is the same as that of the antenna coil. The operation in this preferred embodiment is the same as that in the first preferred embodiment. However, since the height of the conductor of the antenna coil portion is the same as that of the IC mounting portion, a single conductive layer has the same thickness, so that it can be more easily formed than that in the first preferred embodiment. IN addition, it is possible to improve the mounting reliability of the connection portion of the IC chip by a conventional simple technique while it is possible to extend the communication range of the non-contact IC card. Similar to the first preferred embodiment, if elements other than electrical resistance are optimized in order to design an antenna coil and if the material of the conductor is Al, when the conductor thickness of the IC chip connecting terminal and antenna coil portion is 20 µm which is the value of the connecting portion of the IC chip in the first preferred embodiment, the electrical resistance of the antenna coil portion is about 0.4 Ω if the width of the antenna coil is 2.25 mm, so that it is possible to form an antenna coil having the same potential as that in the first preferred embodiment. Since the coil wiring pitch in the first and second preferred embodiments is 3.25 mm, it is possible to achieve t2=2.25 mm in FIG. 3 in the second preferred embodiment.

In this preferred embodiment, the portions of the IC chip connecting terminals, which are arranged below the IC chip, of the conductor forming the antenna coil are thin similar to other portions. If the IC chip connecting terminal portion is thus thinned, it is possible to reduce the decrease of the reliability of the IC chip connecting portion due to the repetition of thermal expansion and thermal contraction of the anisotropic conductive adhesive 25, which occur in longitudinal directions in FIG. 4. Simultaneously, if the width of the antenna portion is increased, it is possible to reduce the electrical resistance of the antenna coil 22. If the conductor thickness of the antenna portion is set to be a suitable value, it is possible to improve the mounting reliability of the IC chip connecting portion while it is possible to extend the communication range of the non-contact IC card.

In addition, the antenna coil is formed along each side of the insulating substrate, and the antenna coil is spaced from each side edge by a distance (d in FIG. 3) of 1 mm or less so as to be substantially coincident with each side edge. Thus, since the antenna coil is formed along the periphery of the insulating substrate, the strength of the insulating substrate is reinforced, so that the effectiveness of the non-contact IC chip is improved.

The prevention of inclination of an IC chip will be described below.

Figure 5:
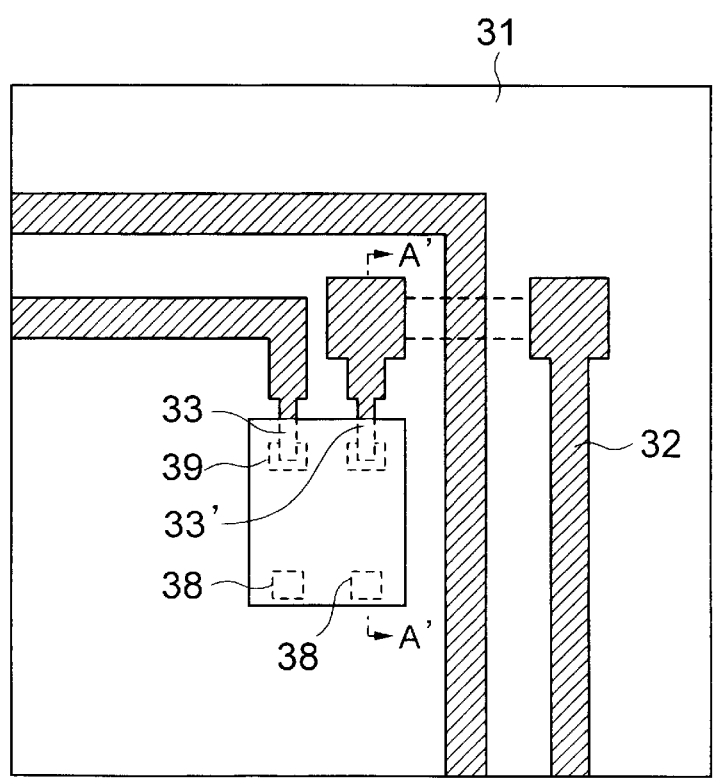
FIG. 5 is a plan view of a non-contact IC card according to the present invention.
Figure 6:
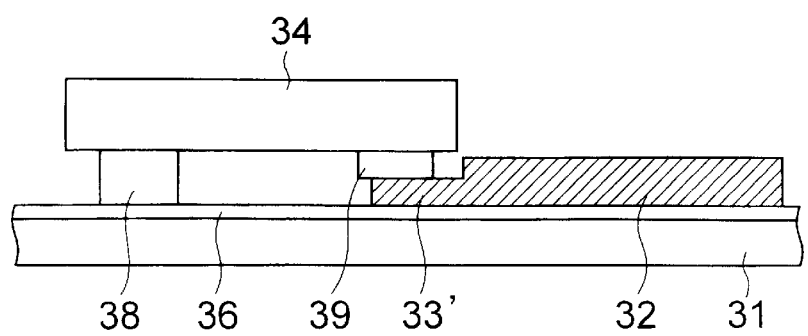
FIG. 6 is a sectional view of an IC chip mounting portion of a non-contact IC card according to the present invention.

FIG. 5 is a plan view of a non-contact IC card according to the present invention, and FIG. 6 is a sectional view of an IC chip mounting portion of a non-contact IC card according to the present invention (a sectional view taken along line A–A' of FIG. 5). The non-contact IC card comprises: an insulating substrate 31 of an insulating material, such as an epoxy resin or a polyimide resin; an antenna coil 32 of a conductor, such as aluminum or copper; IC chip connecting terminals 33 and 33' which constitute a part of the antenna coil 32 and which are electrically connected to an IC chip 34 by means of an adhesive 35, such as an anisotropic conductive adhesive or an NCP; the IC chip 34; and an adhesive 36 for sticking the antenna coil 32 on the insulating substrate 31. The IC card has a short side length of 54 mm, a long side length of 85.6 mm and a thickness of 0.76 mm. The antenna coil 32 of copper or Al is bonded to the major surface of the insulating substrate 31 by means of the adhesive 36. The IC chip 34 is formed inside of the antenna coil 34 at a suitable position. The IC chip 34 is arranged above the IC chip connecting terminals 33 and 33', which are formed on one end and the other end of the antenna coil 32, to be connected to the insulating substrate 31 by means of the adhesive 35, such as an anisotropic conductive adhesive or an NCP. As shown in the figure, a bump 39 and the IC chip connecting terminals 33 and 33', which are arranged between the IC chip 34 and the insulating substrate 31, are surrounded by the anisotropic conductive adhesive 35.

The IC chip 34 is formed with the bump 39 on a connecting electrode (not shown), such as an aluminum pad. This bump 39 is bonded to the IC chip connecting terminals 33 and 33,. Since the IC chip connecting terminals 33 and 33' formed on both ends of the antenna coil 32 are close to each other to be connected to the IC chip 34, one end of the antenna coil 32 and a coil conductor close thereto must be beyond the same conductor to be close to the other end. Therefore, in order to prevent contact with each other, the antenna coil 32 is connected to a reverse conductor 37. The reverse conductor 37 electrically connects the one end of the antenna coil 32 and the coil conductor, which is close thereto, with the coil conductor of other portions by a connecting wiring which is embedded in two through holes formed in the insulating substrate 31.

In this preferred embodiment, the portions of the IC chip connecting terminals 33 and 33', which are arranged below the IC chip 34, of the conductor forming the antenna coil 32 are thinner than other portions. If the IC chip connecting terminal portion is thus thinned, it is possible to reduce the decrease of the reliability of the IC chip connecting portion due to the repetition of thermal expansion and thermal contraction of the anisotropic conductive adhesive 35, which occur in longitudinal directions in FIG. 6. Simultaneously, if the antenna portion is thickened, it is possible to reduce the electrical resistance of the antenna coil 32. If the conductor thickness of the antenna portion is set to be a suitable value, it is possible to improve the mounting reliability of the IC chip connecting portion while it is possible to extend the communication range of the non-contact IC card. This preferred embodiment is characterized in that the IC chip 34 is formed with the bump 39 as well as a dummy bump 38. By forming such a dummy bump 28, the IC chip 34 can be held in parallel to the insulating substrate 31, on which the IC chip 34 is to be mounted, without directly contacting the insulating substrate 31, so that the characteristics of the card can be stable.

According to the present invention, it is possible to enhance the connection reliability of the IC chip mounting portion by decreasing the thickness of the IC chip mounting terminal portion of the conductor of the antenna coil while it is possible to improve communication characteristics by increasing the thickness of the antenna portion.

In addition, the thickness of the antenna portion and IC chip mounting terminal portion of the antenna coil conductor is uniform, and the width of the antenna portion is increased so that the sectional area of the antenna portion obtained by multiplying the width of the antenna portion by the thickness thereof is the same as that according to any one of claims 1 through 3. Thus, it is possible to improve both of the connection reliability of the IC mounting portion and the communication characteristics of the antenna portion.

In addition, according to the present invention, a communication system using the non-contact IC card can have excellent reliability and communication characteristics.

Moreover, according to the present invention, the following effects are obtained. That is, since the IC chip is arranged inside of the antenna coil, the electric and magnetic shielding effects can be obtained. Moreover, since the antenna coil is arranged multiply along the edges on the surface of the insulating substrate, it is possible to enhance the mechanical strength of the substrate. Furthermore, while the antenna coil has been doubly wound in the above described preferred embodiments, the antenna coil may be wound triply or quadruply to further enhance the strength.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A non-contact IC card comprising:
   a substantially rectangular insulating substrate;
   a semiconductor chip mounted on a first face of said insulating substrate; and
   an antenna coil for transmitting information and for enhancing the mechanical strength of said insulating substrate, said antenna coil being arranged on said first face of said insulating substrate along the outer periphery of said first face, and said antenna coil having first and second connecting terminals which are connected to said semiconductor chip,
   wherein said first and second connecting terminals are formed so as to be thinner than a body portion of said antenna coil, and said semiconductor chip is mounted so that terminal portions formed on the bottom surface of said semiconductor chip are put on said first and second connecting terminals so as to decrease a gap between said semiconductor chip and said first face of said insulating substrate, and an adhesive is arranged in said gap for adhering said semiconductor chip to said insulating substrate to electrically connect said terminal portions with said first and second connecting terminals.

2. A non-contact IC card as set forth in claim 1, wherein said antenna coil is arranged so as to be wound doubly or more along the outer periphery of said first face of said insulating substrate.

3. A non-contact IC card as set forth in claim 2, wherein said first connecting terminal is an internal end of said antenna coil, and said second connecting terminal is arranged inside of said antenna coil, said second connecting terminal being connected to an external end of said antenna coil by means of a conductor which extends below said antenna coil.

4. A non-contact IC card as set forth in claim 3, wherein said conductor is arranged on a second face of said insulating substrate, which is a reverse face of said first face.

5. A non-contact IC card as set forth in claim 2, wherein a distance between adjacent portions of said antenna coil, which are wound doubly or more, is smaller than the width of said body portion of said antenna coil.

6. A non-contact IC card as set forth in claim 1, wherein said antenna coil is made of a metal foil selected from the group consisting of copper and aluminum.

7. A non-contact IC card as set forth in claim 1, wherein an anisotropic conductive adhesive is provided between said insulating substrate and said semiconductor chip.

8. An IC card communication system comprising a non-contact IC card and a reader/writer, said non-contact IC card comprising:
   a substantially rectangular insulating substrate;
   a semiconductor chip mounted on a first face of said insulating substrate; and
   an antenna coil for transmitting information and for enhancing the mechanical strength of said insulating substrate, said antenna coil being arranged on said first face of said insulating substrate along the outer periphery of said first face, and said antenna coil having first and second connecting terminals which are connected to said semiconductor chip,
   wherein said non-contact IC card transmits signals from and to said reader/writer via said antenna coil by electromagnetic induction, and
   wherein said first and second connecting terminals are formed so as to be thinner than a body portion of said antenna coil, and said semiconductor chip is mounted so that terminal portions formed on the bottom surface of said semiconductor chip are put on said first and second connecting terminals so as to decrease a gap between said semiconductor chip and said first face of said insulating substrate, and an adhesive is arranged in said gap for adhering said semiconductor chip to said insulating substrate to electrically connect said terminal portions with said first and second connecting terminals.

9. An IC card communication system as set forth in claim 8, wherein said antenna coil is arranged so as to be wound doubly or more along the outer periphery of said first face of said insulating substrate.

10. An IC card communication system as set forth in claim 9, wherein said first connecting terminal is an internal end of said antenna coil, and said second connecting terminal is arranged inside of said antenna coil, said second connecting terminal being connected to an external end of said antenna coil by means of a conductor which extends below said antenna coil.

11. An IC card communication system as set forth in claim 10, wherein said conductor is arranged on a second face of said insulating substrate, which is a reverse face of said first face.

12. An IC card communication system as set forth in claim 9, wherein a distance between adjacent portions of said antenna coil, which are wound doubly or more, is smaller than the width of said body portion of said antenna coil.

13. An IC card communication system as set forth in clam 8, wherein said antenna coil is made of a metal foil selected from the group consisting of copper and aluminum.

14. An IC card communication system as set forth in claim 8, wherein an anisotropic conductive adhesive is provided between said insulating substrate and said semiconductor chip.

* * * * *